United States Patent [19]

Callahan

[11] Patent Number: 5,604,694
[45] Date of Patent: Feb. 18, 1997

[54] CHARGE PUMP ADDRESSING

[75] Inventor: John Callahan, Fremont, Calif.

[73] Assignee: VLSI Technology, Inc., San Jose, Calif.

[21] Appl. No.: 586,138

[22] Filed: Jan. 16, 1996

[51] Int. Cl.$^6$ .................................................. G11C 17/00
[52] U.S. Cl. .......................... 365/96; 365/225.7; 327/536
[58] Field of Search .................................. 365/96, 225.7; 327/536; 257/299, 530

[56] References Cited

U.S. PATENT DOCUMENTS

| | | | |
|---|---|---|---|
| 5,148,391 | 9/1992 | Zagar | 365/96 |
| 5,495,436 | 2/1996 | Callahan | 365/96 |

Primary Examiner—Joseph A. Popek
Attorney, Agent, or Firm—Patrick T. King

[57] ABSTRACT

An improved charge pump circuit uses standard low-voltage fabrication process for programming an anti-fuse memory cell from a high-voltage current source. A column-selection transistor which has a gate terminal connected to a control terminal. The column-select transistor is connected between a high voltage programming current source and one terminal of an anti-fuse link. The other terminal of the anti-fuse link is connected through a word-selection transistor to ground. The gate terminal of the word-selection transistor is connected to a word selection line. Two oppositely phased charge pumps provide a boosted voltage. A trapping-diode-connected transistor isolates the boosted voltage from the gate terminal of the column-selection transistor. A charge-kicker circuit further boosts the voltage on the gate of the column-selection transistor to turn on and pass current from the high voltage programming current source through the anti-fuse link.

28 Claims, 2 Drawing Sheets

CHARGE PUMP ADDRESSING

BACKGROUND OF THE INVENTION

1. Field of the Invention.

This invention relates to integrated circuit charge pumps and, more particularly, to charge pumps for more effectively providing programming voltages to anti-fuse read only memory (ROM) devices.

2. Prior Art

An anti-fuse ROM device is composed of an array of columns and rows, or words, of memory cells, where each memory cell includes an anti-fuse element in one of two logic states, that is, in either a unprogrammed, high-resistance state or in a programmed, low-resistance state. A column, or bit, select line has a number of memory cells containing anti-fuse elements, or links, connected thereto. An unprogrammed anti-fuse link has a resistance on the order of 1 gigohm, and a programmed anti-fuse link has a resistance on the order of 200 ohms.

For programming a typical anti-fuse link, one terminal of the anti-fuse link is connected to a high voltage programming current source using the column select line. The other terminal of the anti-fuse link is connected to a drain terminal of a word, or row, select transistor. The source terminal of the word select transistor is connected to ground. The gate terminal of the word select transistor is connected to a word line. To program an anti-fuse link, a word-select signal is applied to the word line. This turns on the word select transistor and connects the high voltage programming current source to the anti-fuse link. Other anti-fuse links of a memory array are similarly programmed by similar selection of a column and a row.

One prior art technique for providing programming voltages to a row-and-column array of anti-fuse read only memory (ROM) device uses a charge pump to boost the gate voltage provided to the gate terminals of a column of cell selection transistors. Each one of the cell-selection transistors connects one particular anti-fuse element of a column of anti-fuse elements to a high-voltage programming current source. A word-selection transistor grounds the other ends of a row of anti-fuse elements. A particular anti-fuse element is selected for programming by selecting an appropriate column for one terminal of a selected fuse element applying a boosted gate voltage thereto. The boosted gate voltage causes a high-voltage programming current source to be connected to a selected anti-fuse element.

During normal operation, an anti-fuse ROM is operated with a VCC voltage of 5 volts. During a programming operation, it is desirable the VCC voltage for an anti-fuse ROM be boosted to a higher voltage, such as 6.5 volts, in order to improve the chances of programming marginal cells and to obtain better yields. However, a problem arises when operating an anti-fuse ROM at 6.5 volts during a programming operation. That problem is that the various standard circuits used to provide the logic signals and the addressing signals to the memory do not function at a VCC of 6.5 v. As a result a VCC voltage of 5.5 volts must be used during programming operations.

It has been found that the column selection circuitry using a higher VCC voltage of 6.5 volts works with, for example, devices produced with a memory-device fabrication process with a 0.8 micron geometry. But, using a lower VCC of 5.5 volts does not work with a memory process having a smaller geometry such as, for example, a 0.6 micron process. In the smaller geometry process, the voltage for the high voltage programming current source is lower and a 5.5 volt VCC must be used. However, for a 0.6 micron process, the conventional charge pump circuit used in the larger geometry processes of does not operate.

A need has arisen for a technique for providing programming voltages to anti-fuse ROM devices with smaller geometry memory cells within the VCC voltage constraints required for logic and addressing functions.

FIG I shows a conventional circuit 100 used for addressing and programming an anti-fuse link in memory cells (typically shown as 102), where the memory cells are arranged in columns and rows. The circuit 100 was used for previous generations of anti-fuse memory devices. As integrated-circuit elements grow smaller due to improvements in processing technology, programming smaller geometry memory cells within more limited voltage constraints requires improvements to the circuits in order to handle constraints imposed by smaller geometries.

A typical memory cell 102 includes an anti-fuse link 104 having a first terminal and a second terminal. An unprogrammed anti-fuse link has a resistance on the order of 1 gigohm, and a programmed anti-fuse link has a resistance on the order of 200 ohms. There is a column selection transistor 106 having a drain terminal connected to a line 108 which is connected to a high-voltage (13 volts, for example) programming current source. The column-selection transistor 106 has a source terminal which is connected to one terminal of a number of anti-fuse links including 104. A gate terminal is connected to a line 110 on which is provided a boosted column-select signal.

Another problem with prior programming techniques for providing programming voltages for anti-fuse ROM device is junction breakdown. A charge pump circuit provides a voltage which ramps up until the junction breakdown voltage is reached. This limits how high the voltage output of the charge pump can go. In prior art circuits, the voltage provided at the top of an anti-fuse link is body effect plus two threshold voltage drops down from the charge-pump output voltage, or approximately 4 volts down, from the junction breakdown voltage of the charge-pump transistor. The memory cell 102 also includes a word-selection transistor 112 which has a drain terminal connected to the second terminal of the anti-fuse link 104. The word selection transistor 112 has a source terminal connected to a ground reference voltage. A gate terminal of the word selection transistor 112 is connected to a word selection line, or word line 114.

A column is selected with a high-voltage blocking transistor 116 which has a drain terminal connected to a SHIFT REGISTER OUTPUT terminal 118 at which is provided a column-select signal from a column-select shift register (not shown). The column-select signal activates the high-voltage blocking transistor 116 by providing a VCC signal on the drain of high-voltage blocking transistor 116, which has a gate terminal connected to a VCC voltage and which a source terminal connected to line 110. Line 110 is provided with a boosted column-select signal using a charge pump circuit 120, which includes transistors 122, 124, 126. Transistor 122 has a drain terminal connected to a line 128 on which is provided HIGH VOLTAGE SETUP voltage between 10 and 13 volts. A gate terminal of transistor 122 is connected to line 110. A source terminal of transistor 122 is connected to a terminal 130. Transistor 124 has a drain terminal and a gate terminal connected to terminal 130. The source terminal of transistor 124 is connected to line 110.

Transistor 126 is connected as a capacitor with its gate terminal connected to terminal 130 and with its source and drain terminals connected to an OSC line 132, on which is provided an oscillator signal alternating between zero volts and VCC.

The column-select shift register selects the particular column shown in FIG. 1 of the memory array by providing a VCC-level signal at the SHIFT REGISTER OUTPUT terminal 118. The shift register selects a particular column of the prior art larger geometry circuit shown in FIG. 1 by delivering a 6.5 volt signal to the top of transistor 116. This 6.5 volt signal passes through transistor 116 to put approximately 5 volts on line 110. This approximately 5 volt signal on line 110 turns on transistor 122 which, in turn, passes on approximately 3.5 volts to the gate terminal of transistor 126 which turns on transistor 126. Transistor 126 functions as a capacitor.

Charge pump circuit 120 depicts a typical charge pump configuration. During the positive swing of the oscillator signal on OSC line 132, line 132 delivers charge through transistor 126 and through transistor 124 to line 110. That charge is trapped on line 110 to thereby increase, or boost, the voltage on line 110. This boost in the voltage on line 110 also causes transistor 122 to supply additional charge to node 130 at the same time that the capacitor-connected transistor 126 tries to take back charge during the negative swing on OSC line 132. The next positive swing of the oscillator voltage rides on top of the voltage on node 130 which results in even more voltage on line 110. This cycle is repeated and allows the voltage on 110 to increase past the point where transistor 116 is cut off.

It has also been found that the prior art configuration of FIG. 1 has a problem when it is used with newer, smaller integrated-circuit device geometries. The problem is that the various library cells used to provide logic signals and addressing to the memory cell do not work at a VCC of 6.5 v. This requires a VCC of 5.5 volts to be used during programming. Memory cells for the newer, smaller device geometries have lower breakdown voltages. While a lower VCC was found to work for prior larger device geometries, it does not work for the newer, smaller device geometries, where a 5.5 volt VCC is used along with a lower voltage for a high-voltage programming charge source. Under the conditions required by the smaller device geometries, a charge pump circuit does not function. The circuit shown in FIG. 1 is unable to program anti-fuse devices using the newer, smaller device geometries. In the prior art, the highest breakdown voltage occurs at node 130. If the junction breakdown voltage is 17 volts, this voltage limits every other voltage throughout the circuit, such as 15 volts at line 110 and 13 volts at the anti-fuse link 104.

What is needed is a charge pump circuit for providing high-voltage programming and control voltages for anti-fuse read only memory (ROM) devices and for other applications where the charge-pump circuit is not limited by the breakdown voltages of its transistor elements.

SUMMARY OF THE INVENTION

It is therefore an object of the invention to provide techniques for more effectively providing programming voltages to anti-fuse read only memory (ROM) devices.

The invention is useful in any application which requires a high voltage to be logically controlled and steered around through transistors, such as required for programming anti-fuse elements. The invention is not limited to anti-fuse applications. Where the voltages used are close to the natural breakdown voltages of the fabrication process for the transistor, the invention provides an advantage.

The invention uses a standard low-voltage integrated-circuit fabrication process to provide high-voltage programming functions. This is usually not possible with standard fabrication processes because of voltage-breakdown limitations. An important aspect of the invention is that its circuits operate within the voltage-breakdown limits of the conventional fabrication process, while still allowing high-voltage programming and control signals to be distributed to the various anti-fuse links. An advantage is that an inexpensive, standard fabrication process can be used to provide on-chip non-standard, high-voltage programming without having to provide a special EPROM fabrication process. The fabrication process is a standard ASIC process with a few extra masking steps added to allow on-chip anti-fuse programming control functions.

An improved charge pump circuit according to the invention includes a high-voltage blocking transistor which has a drain terminal connected to a shift register output terminal at which is provided a select signal to activate the select transistor; which has a gate terminal connected to a VCC voltage; and which has a source terminal connected to a charge output pump terminal.

The improved charge pump circuit includes a charge pump including a high-voltage setup transistor having a drain terminal connected to a high voltage setup line, having a gate terminal connected to a pump terminal, and having a source terminal connected to a pump-gate terminal. The improved charge pump circuit includes also includes a pump transistor which has a drain terminal and a gate terminal connected to a pump-gate terminal and which has a source terminal connected to a pump terminal. The charge pump also includes a capacitor-connected transistor which has a gate terminal connected to the pump-gate terminal and which has source and drain terminals connected to an OSC1 terminal at which is provided an alternating voltage signal.

The improved charge pump circuit includes a trapping-diode-connected transistor which has a gate terminal and a drain terminal connected to the pump output terminal and which has a source terminal connected to a column select transistor gate terminal. The improved charge pump circuit includes a charge-kicker circuit including a capacitor-connected transistor which has a gate terminal connected to column select transistor gate and which has source and drain terminals connected to an OSC2 terminal.

The improved charge pump circuit includes a second charge pump similar to the first charge pump described herein above.

The improved charge pump circuit also includes a shunt transistor which has a source terminal connected to ground reference terminal, which has a drain terminal connected to the column select transistor gate terminal and which has a gate terminal. The improved charge pump circuit includes an inverter which has an output terminal connected to the gate terminal of the shunt transistor and which has an input terminal connected to the shift register output terminal, such that the shunt transistor connects the column select transistor gate terminal to the ground reference potential when the shift register output terminal is not activated.

Another aspect of the invention provides as improved charge pump circuit for programming an anti-fuse memory cell from a high-voltage programming current source. The memory cell includes an anti-fuse link having a first terminal and a second terminal. There is a column-selection transistor having a drain terminal connected to the high voltage current source, having a source terminal connected to one terminal of the anti-fuse link, and having a gate terminal connected to a column select transistor gate. The memory cell includes a word-selection transistor, wherein the word selection transistor has a drain terminal connected to the second terminal of the anti-fuse link, wherein the word selection transistor has a source terminal connected to a ground reference voltage, and wherein the word selection transistor has a gate terminal connected to a word selection line.

A high-voltage blocking transistor has a drain terminal connected to a shift register output terminal at which is provided a column-select signal to activate the column select transistor. The high-voltage blocking transistor has a gate terminal connected to a VCC voltage and has a source terminal connected to a pump output terminal. The high-voltage blocking transistor prevents high voltage from affecting the low-voltage shift register output.

A first charge pump includes: a high-voltage setup transistor having a drain terminal connected to a high voltage setup line, having a gate terminal connected to a pump output terminal, and having a source terminal connected to a pump-gate terminal; a first pump transistor having a drain terminal and a gate terminal connected to the pump-gate terminal, and having a source terminal connected to the pump output terminal; and a capacitor-connected transistor which has a gate terminal connected to the pump-gate terminal and which has source and drain terminals connected to an OSC1 terminal;

Similarly a second charge pump includes: a second high-voltage setup transistor having a drain terminal connected to the high voltage setup line, having a gate terminal connected to the pump output terminal, and having a source terminal connected to a second pump-gate terminal; a second transistor having a drain terminal and a gate terminal connected to the second pump-gate terminal, and having a source terminal connected to the pump output terminal; and a capacitor-connected transistor, which has a gate terminal connected to the second pump-gate terminal and which has source and drain terminals connected to an inverted OSC1 terminal at which is provided an alternating voltage signal.

A trapping-diode-connected transistor has a gate terminal and a drain terminal connected to pump terminal and which has a source terminal connected to column select transistor gate. A charge-kicker circuit includes a capacitor-connected transistor which has a gate terminal connected to column select transistor gate and which has source and drain terminals connected to an OSC2 terminal at which is provided an oppositely-phased alternating voltage signal.

A shunt transistor is provided which has a source terminal connected to ground reference terminal, which has a drain terminal connected to column select transistor gate, and which has a gate terminal. An inverter which has an output terminal connected to the gate terminal of the shunt transistor and which has an input terminal connected to the shift register output terminal, such that the shunt transistor connects column select transistor gate to the ground reference potential when the shift register output terminal is not activated.

The invention includes means for selecting one of said memory cells for programming from a plurality of memory cells, wherein said means for selecting includes means for selecting a column and a row corresponding to the selected memory cell.

A method of programming an anti-fuse memory cell comprises the step of selecting a column corresponding to a selected anti-fuse memory cell by providing a shift register column select output signal to a drain terminal of a high-voltage blocking transistor which has a gate terminal connected to a VCC voltage and which has a source terminal connected to a pump output terminal of a first charge pump. The first charge pump includes a transistor having a drain terminal connected to a high voltage setup line, having a gate terminal connected to the pump output terminal, and having a source terminal connected to a pump-gate terminal. A pump transistor has a drain terminal and a gate terminal connected to high-voltage setup transistor, and has a source terminal connected to pump terminal. A capacitor-connected transistor which has a gate terminal connected to pump-gate terminal and which has source and drain terminals connected to an alternating voltage signal at an OSC1 terminal.

The method includes pumping the pump output terminal with a second charge pump circuit which is similar to the first charge pump, but of opposite phase and which includes another transistor having a drain terminal connected to the high voltage setup line, having a gate terminal connected to pump terminal, and having a source terminal connected to a second pump-gate terminal; a transistor having a drain terminal and a gate terminal connected to second pump-gate terminal, and having a source terminal connected to pump terminal; and a capacitor-connected transistor which has a gate terminal connected to second pump-gate terminal and which has source and drain connected to an inverted OSC1 terminal.

The method includes the step of trapping voltage on column select transistor gate with a trapping-diode-connected transistor which has a gate terminal and a drain terminal connected to the pump output terminal and which has a source terminal connected to the column select transistor gate terminal.

The method includes the step of increasing the voltage on the column select transistor gate terminal with a charge-kicker circuit including a capacitor-connected transistor which has a gate terminal connected to the column select transistor gate and which has source and drain terminals connected to the OSC1 terminal.

The method includes the step of selecting a column corresponding to a selected anti-fuse memory cell by providing a high-voltage to a gate terminal of a column-selection transistor which has a drain terminal connected to a high-voltage programming current source and which has a source terminal connected to one terminal of the anti-fuse links in a column.

The method includes the step of selecting a row corresponding to the selected anti-fuse memory cell by providing a row selection voltage on the gate of a word-selection transistor which has a drain terminal connected to the other terminal of the anti-fuse link and which has source terminal connected to a ground reference voltage.

The method further includes shunting the voltage on column select transistor gate to a ground reference voltage through a shunt transistor which has a source terminal connected to ground reference terminal, which has a drain terminal connected to column select transistor gate, and which has a gate terminal connected through an inverter which has an input terminal connected to the shift register output terminal, such that the shunt transistor connects column select transistor gate to the ground reference potential when the column select transistor is not activated.

The method additionally includes the step of selecting one of said memory cells for programming from a plurality of memory cells by selecting a column and a row corresponding to the selected memory cell from the plurality of memory cells.

BRIEF DESCRIPTION OF THE DRAWINGS.

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
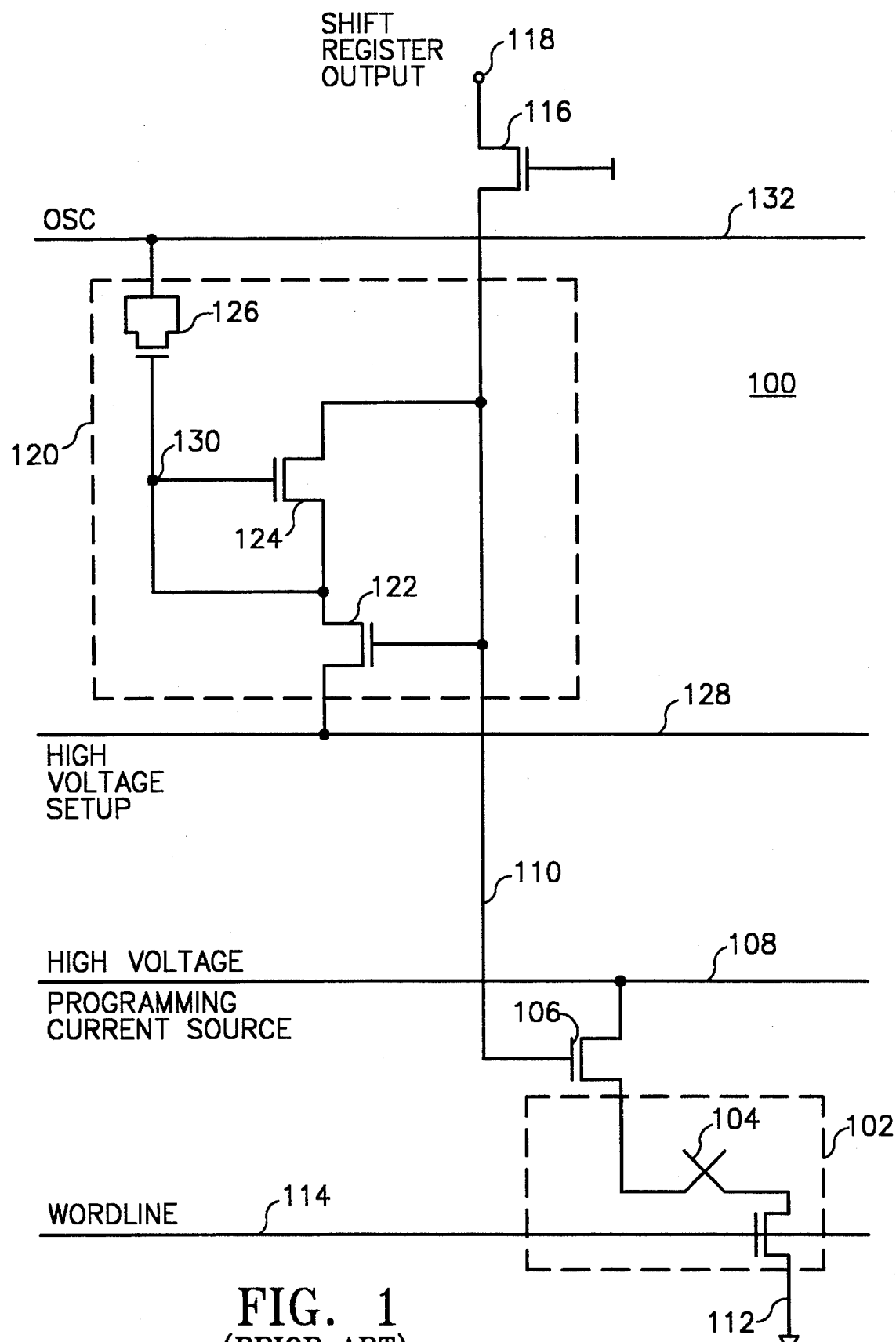
FIG. 1 is a prior art circuit for addressing and programming an anti-fuse link in an anti-fuse memory array.
Figure 2:
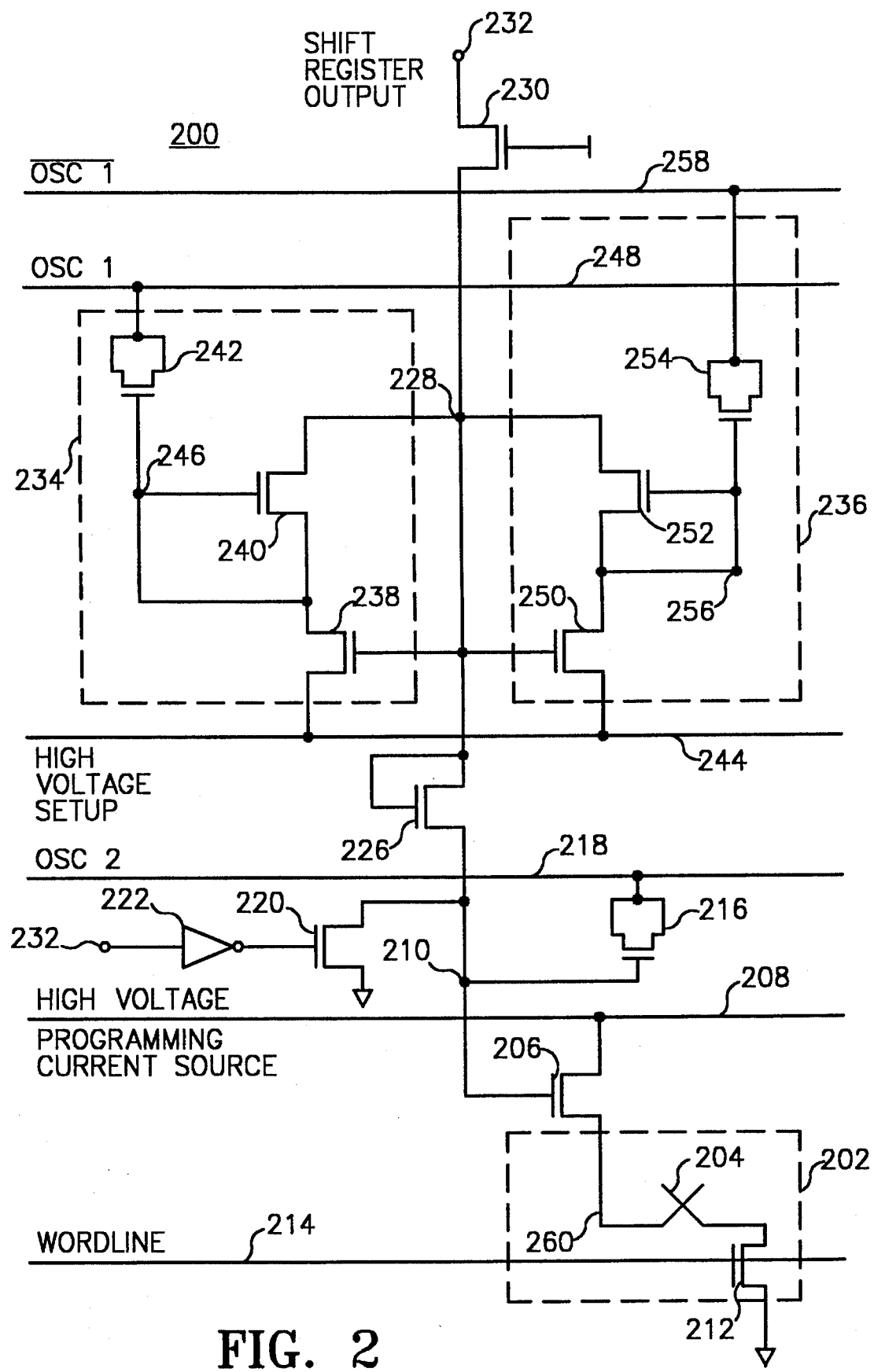
FIG. 2 is a circuit showing an improved charge-pump circuit for addressing and programming an anti-fuse link in an anti-fuse memory array.

FIG. 2 shows an improved dual-charge-pump and kicker circuit 200 for programming a typically shown anti-fuse memory cell 202 having an anti-fuse link 204. The anti-fuse link 204 has a first terminal and a second terminal. An unprogrammed anti-fuse link has a resistance on the order of 1 gigohm, and a programmed anti-fuse link has a resistance on the order of 200 ohms.

A column-selection transistor 206 is provided having a drain terminal connected to a line 208 which is connected to a high-voltage programming current source, the voltage of which varies between 9.5 and 13 volts, depending on current drain. The column-selection transistor 206 has a source terminal which is connected to one terminal of the anti-fuse link 204. A gate terminal of the cell-selection transistor 206 is connected to a column select transistor gate terminal 210 on which is provided a further boosted column-select signal.

The memory cell 202 also includes a word-selection transistor 212 which has a drain terminal connected to the second terminal of the anti-fuse link 204. The word selection transistor 212 has a source terminal connected to a ground reference voltage. A gate terminal of the word selection transistor 212 is connected to a word selection line, or word line 214 to allow selection of link 204 from a plurality of other links connected also to the source terminal of transistor 206.

A charge-kicker circuit is provided by a capacitor-connected transistor 216 which has its gate terminal connected to column select transistor gate terminal 210 and which has its source and drain terminals connected to an OSC2 line 218, on which is provided an oscillator signal alternating between zero volts and VCC. Positive excursions of the oscillator signal on line 218 boost the voltage on column select transistor gate terminal 210. To discharge column select transistor gate terminal 210 when the column corresponding to column select transistor gate terminal 210 is not selected for programming, a shunt transistor 220 is provided. A drain terminal of the shunt transistor 220 is connected to column select transistor gate terminal 210 and a source terminal of the shunt transistor 220 is connected to a ground reference terminal. A gate terminal of the shunt transistor 220 is connected to the output terminal of an inverter 222. An input terminal of the inverter 222 is connected to a shift register output terminal 232. The shunt transistor 220 connects column select transistor gate terminal 210 to the ground reference potential when the corresponding column is not activated for programming of a anti-fuse link.

A diode-connected transistor 226 functions as a trapping diode to hold charge on column select transistor gate terminal 210. The diode-connected transistor 226 has a source terminal connected to column select transistor gate terminal 210. A gate terminal and a drain terminal are connected to a pump output terminal 228.

A column of memory cells which contains an anti-fuse link to be programmed is selected with a high-voltage blocking transistor 230. The high-voltage blocking transistor 230 has a drain terminal connected to a shift register output terminal 232. Shift register output terminal 232 is provided with a column-select signal from the column-select shift register (not shown). The column-select signal activates the transistor 230 by providing a VCC signal from a shift-register output terminal to the drain of the high-voltage blocking transistor 230. A gate terminal of the high-voltage blocking transistor 230 is connected to a VCC voltage and a source terminal of the high-voltage blocking transistor 230 is connected to pump output terminal 228.

Pump output terminal 228 is provided with a boosted column-select voltage using two oppositely-phased charge pump circuits 234 and 236 which are operated with oscillators signals having a frequency of, for example, approximately 30 MHz.

The first charge pump circuit 234 includes high-voltage setup transistors 238, 240, 242. High-voltage setup transistor 238 has a drain terminal connected to a line 244 on which is provided high voltage setup voltage with a typical value of 13 volts. A gate terminal of transistor 238 is connected to pump output terminal 228. A high-voltage setup transistor 238 is connected to a pump-gate terminal 246. Pump transistor 240 of the first charge pump circuit 234 has a drain terminal and a gate terminal connected to pump-gate terminal 246. The source terminal of pump transistor 240 is connected to pump terminal 228. Transistor 242 of the first charge pump circuit 234 is connected as a capacitor with its gate terminal connected to pump-gate terminal 246 and with its source and drain terminals connected to an OSC1 line 248, on which is provided the same oscillator signal alternating between zero volts and VCC as provided on line 218.

The second charge pump circuit 236 includes transistors 250, 252, 254. Transistor 250 has a drain terminal connected to line 244 on which is provided high voltage setup voltage with a typical value of 13 volts. A gate terminal of transistor 250 is connected to terminal 228. A source terminal of transistor 250 is connected to a terminal 256. Transistor 252 of the second charge pump circuit 236 has a drain terminal and a gate terminal connected to terminal 256. The source terminal of transistor 252 is connected to terminal 228. Transistor 254 of the second charge pump circuit 236 is connected as a capacitor with its gate terminal connected to terminal 256 and with its source and drain terminals connected to an inverted OSC1 line 258, on which is provided an oscillator signal alternating between zero volts and VCC which is opposite in phase to that provided on line 248.

The column-select shift register selects the particular column shown in FIG. 2 of the memory array by providing a VCC-level signal at the shift register output terminal 232. The shift register output goes through the transistor 230. There are two oppositely-phased charge pumps operating to provide charge to pump output terminal 228. The first charge pump 234 is driven by an OSC1 signal on line 248 and the second charge pump 236 is driven by an inverted OSC1 signal on line 258. Both charge pumps are sufficient to initiate charge pumping action by bringing up the voltage on pump output terminal 228 to the point where the voltages on node 246 in the first charge pump and on node 256 in the second charge pump can increase.

It has been found that the voltage on pump output terminal 228 only goes to 11.91 volts where 13.5 volts is desired. The solution to this is to send the voltage on terminal 228 through the trapping diode provided by diode-connected transistor 226 to the column select transistor gate terminal 210. The voltage on column select transistor gate terminal 210 is at 9.5 volts, which is one threshold plus body effect down from line 228. However, the OSC2 signal on line 218 pumps the voltage on column select transistor gate terminal 210 to 13.78 volts, which is more than enough to eliminate any threshold voltage drop through the column-select transistor 206. The arrangement of FIG. 2 thereby assures that the full voltage of the programming current source connected to line 208 is passed to the top of the anti-fuse link 204.

The method of programming the anti-fuse memory cell 202 includes selecting a column corresponding to a selected anti-fuse memory cell by providing a shift register column select output signal to a drain terminal of the column-select transistor 230. The column-select transistor 230 has a gate terminal connected to the VCC voltage and has a source terminal connected to the voltage boosted line 228. The voltage boosted column select transistor gate 228 is pumped with a first charge pump 234 and with the oppositely-phased second charge pump 236. It has been found that both charge pumps are sufficient to initiate charge pumping action by bringing up the voltage on column select transistor gate 228 to the point where the voltages on node 246 in the first charge pump and on node 256 in the second charge pump can increase.

Because it has been found that the voltage on column select transistor gate 228 only goes to 11.91 volts where 13.5 volts is desired, the instant invention provides an additional voltage-kicker circuit which uses the capacitor-connected transistor 216 to pump charge onto column select transistor gate terminal 210. The trapping diode-connected transistor 226 directs voltage from pump terminal 228 to column select transistor gate 210. The voltage on column select transistor gate terminal 210 is then increased with the charge-kicker transistor 216.

A column corresponding to a selected anti-fuse memory cell is selected by providing the voltage on column select transistor gate terminal 210 to the gate terminal of the column-selection transistor 206 which has its source terminal connected to one terminal of the anti-fuse link 204. The drain terminal of the cell-selection transistor 206 is connected to the high-voltage programming current source which is connected to line 208. The voltage on line 260 varies because the charge-kicker transistor periodically kicks the voltage on terminal 210 to a higher value. The voltage on column select transistor gate terminal 210 consequently ranges between 9.5 and 12.78 volts and the current through the anti-fuse link ranges between 18 and 22 milliamperes.

A row corresponding to the selected anti-fuse memory cell is selected by providing a row selection voltage on the gate of the word-selection transistor 212 which connects the anti-fuse link to the ground reference voltage.

The voltage on column select transistor gate terminal 210 is shunted to a ground reference voltage through the shunt transistor 220 which has its gate terminal connected through an inverter to the shift register output terminal 232, such that the shunt transistor 220 connects column select transistor gate terminal 210 to the ground reference potential when shift register output terminal 232 is not activated.

One of the memory cells is selected for programming from a plurality of memory cells by selecting a column and a row corresponding to the selected memory cell from the plurality of memory cells.

The voltages at various points within the circuit 200 are as follows: When a memory circuit is selected for programming a voltage is supplied to the high voltage setup line 244 which rises in 100 nanoseconds to 10 volts to start operation of the charge pumps. The OSC1 signal and the inverted OSC1 signal on lines 248 and 258 are square waves which vary between 0.1 and 5.5 volts with a period of 35 nanoseconds. The variation in the voltages produced by the OSC1 and inverted OSC1 signal occurs in synchronization with the 35 nanosecond period. The voltages at pump gate terminals 246 and 256 in the respective charge pumps 234, 236 initially vary between 2.9 and 4.8 volts and gradually rise up to a final steady-state which varies between 9.66 and 13.24 volts. The voltage on pump terminal 228 rises from 4.11 volts to a final steady-state value which varies between 11.45 and 11.18 volts. The voltage on column select transistor gate terminal 210 initially varies between 2.9 and 4.57 volts and rises to a final steady-state level which varies between 9.5 and 12.78 volts. The final steady-state voltage on the high voltage programming current source line 208 varies between 9.5 and 13.78 volts with a the current to the link varying between 18 and 22 milliamperes, or averaging 20 milliamperes.

Alternate embodiments of the invention shown in FIG. 2 include use just one charge pump as before while using the isolation diode and the charge kicker circuit. For a 0.8 micron fabrication process, process yield would be better using one charge pump and using the isolation diode and the charge kicker circuit because the breakdown voltages for the 0.8 micron fabrication process are not a problem.

In the prior art, the highest breakdown voltage occurs across the source junction of the pump transistor. If the junction breakdown voltage is 16 volts, this voltage limits every other voltage throughout the circuit.

The invention provides only one threshold voltage drop plus a body-effect voltage drop so that a couple of volts are saved. This gives several more volts as a breakdown margin. The invention allows the voltage to be pumped up even if the voltage is initially limited by breakdown in a charge pump circuit.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. An improved charge pump circuit, comprising:
   a high-voltage blocking transistor (230) having a drain terminal connected to a shift register output terminal (232) at which is provided a select signal to activate the high-voltage blocking transistor, the high-voltage blocking transistor (230) having a gate terminal connected to a VCC voltage; and the high-voltage blocking transistor (230) having a source terminal connected to a charge pump output terminal (228);

a first charge pump (234) including:
  a first high-voltage setup transistor (238), which has a drain terminal connected to a high-voltage setup line (244), which has a gate terminal connected to the pump output terminal (228), and which has a source terminal connected to a pump-gate terminal (246);
  a first pump transistor (240) which has a drain terminal and a gate terminal, both connected to the source terminal of the first setup transistor, and to the pump gate terminal (246) and which has a source terminal connected to the pump output terminal (228);
  a first capacitor-connected transistor (242) which has a gate terminal connected to pump-gate terminal (246) and which has source and drain terminals connected to an oscillator-input terminal (248) at which is provided an alternating signal voltage;

a diode-connected trapping transistor (226) which has a gate terminal and a drain terminal both connected to the pump output terminal (228) and which has a source terminal connected to a column-select transistor gate terminal (210);

a charge-kicker circuit including a capacitor-connected transistor (216), which has a gate terminal connected to column-select transistor gate terminal (210) and which has both source and drain terminals connected to an oscillator-input terminal (218) at which is provided an alternating signal voltage.

2. The improved charge pump circuit of claim 1 further including a second charge pump (236) having:
  a second high-voltage setup transistor (250) which has a drain terminal connected to the high voltage setup line (244), which has a gate terminal connected to the pump output terminal (228), and which has a second pump-gate terminal (256);
  a second pump transistor (252) which has a drain terminal and a gate terminal, both connected to the second pump-gate terminal (256) of the second setup transistor, and which has a source terminal connected to the pump output terminal (228);
  a second capacitor-connected transistor (254) which has a gate terminal connected to the second pump-gate terminal (256) of the second setup transistor and which has source and drain terminals connected to the oscillator-input terminal (258) at which is provided an alternating signal voltage.

3. The circuit of claim 1 including:
  a shunt transistor (220) which has a source terminal connected to a ground reference voltage, which has a drain terminal connected to the gate-control terminal (210), and which has a gate terminal which is coupled to the shift register output terminal (232) at which is provided a select signal to activate the select transistor such that the shunt transistor (220) connects the gate-control terminal (210) to the ground reference voltage when the high-voltage blocking transistor (230) is not activated.

4. The circuit of claim 1 wherein said transistors are NMOS transistors.

5. An improved dual charge pump circuit, comprising:
  a high-voltage blocking transistor (230) having a drain terminal connected to a shift register output terminal (232) at which is provided a select signal to activate the high-voltage blocking transistor, the high-voltage blocking transistor (230) having a gate terminal connected to a VCC voltage; and the high-voltage blocking transistor (230) having a source terminal connected to a pump output terminal (228);

a first charge pump (234) including:
  a first high-voltage setup transistor (238), which has a drain terminal connected to a high voltage setup line (244), which has a gate terminal connected to the pump output terminal (228) and which has a source terminal connected to a pump-gate terminal (246);
  a first pump transistor (240) which has a drain terminal and a gate terminal, both connected to the pump-gate terminal (246) and which has a source terminal connected to the pump output terminal (228); a first capacitor-connected transistor (242) which has a gate terminal connected to the pump-gate terminal (246) of the first setup transistor and which has source and drain terminals connected to an oscillator-input terminal (248) at which is provided a first alternating signal voltage;

a second charge pump (236) having:
  a second high-voltage setup transistor (250) which has a drain terminal connected to the high voltage setup line (244), which has a gate terminal connected to the pump output terminal (228), and which has a source terminal connected to a second pump-gate terminal (256);
  a second pump transistor (252) which has a drain terminal and a gate terminal, both connected to the second pump-gate terminal (256) and which has a source terminal connected to the pump output terminal (228);
  a second capacitor-connected transistor (254) which has a gate terminal connected to the source terminal of the second high-voltage setup transistor and which has source and drain terminals connected to an oscillator-input terminal (258) at which is provided a second alternating signal voltage having a phase opposite to the phase of the first alternating signal source;

a diode-connected trapping transistor (226) which has a gate terminal and a drain terminal both connected to the pump output terminal (228) and which has a source terminal connected to a column-select transistor gate terminal (210);

a charge-kicker circuit including a capacitor-connected transistor (216), which has a gate terminal connected to column select transistor gate terminal (210) and which has both source and drain terminals connected to an oscillator-input terminal (218) at which is provided an alternating signal voltage.

6. The circuit of claim 5 including:
  a shunt transistor (220) which has a source terminal connected to a ground reference voltage, which has a drain terminal connected to terminal (210), and which has a gate terminal which is coupled to the shift register output terminal (232) at which is provided a select signal to activate the select transistor such that the shunt transistor (220) connects the gate-control terminal (210) to the ground reference voltage when the shift register output terminal (232) is not activated.

7. The circuit of claim 5 wherein said transistors are NMOS transistors.

8. An improved charge pump circuit for programming an anti-fuse memory cell, comprising:

a memory cell (202) to be programmed from a high-voltage programming current source (208), wherein the memory cell includes an anti-fuse link (204) having a first terminal and a second terminal;

a column-selection transistor (206) having a drain terminal connected to a high-voltage current source, having a source terminal connected to the first terminal of the anti-fuse link, and having a gate terminal connected to a column-select transistor gate terminal (210);

wherein the memory cell includes a word-selection transistor (212), wherein the word selection transistor has a drain terminal connected to the second terminal of the anti-fuse link, wherein the word selection transistor has a source terminal connected to a ground reference voltage, and wherein the word selection transistor has a gate terminal connected to a word selection line (214);

a high-voltage blocking transistor (230) having a drain terminal connected to a shift register output terminal (232) at which is provided a select signal to activate the high-voltage blocking transistor, the high-voltage blocking transistor (230) having a gate terminal connected to a VCC voltage, and the high-voltage blocking transistor (230) having a source terminal connected to a charge pump output terminal (228);

a first charge pump (234) including:

a first high-voltage setup transistor (238), which has a drain terminal connected to a high-voltage setup line (244), which has a gate terminal connected to pump output terminal (228) and which has a source terminal connected to a pump gate terminal (246);

a first pump transistor (240) which has a drain terminal and a gate terminal, both connected to the source terminal of the first setup transistor, and which has a source terminal connected to the pump output terminal (228);

a first capacitor-connected transistor (242) which has a gate terminal connected to the source pump-gate terminal (246) of the first setup transistor and which has source and drain terminals connected to an oscillator-input terminal (248) at which is provided an alternating signal voltage;

a diode-connected trapping transistor (226) which has a gate terminal and a drain terminal both connected to the pump output terminal (228) and which has a source terminal connected to the column-select transistor gate terminal (210);

a charge-kicker circuit including a capacitor-connected transistor (216), which has a gate terminal connected to the column select transistor gate terminal (210) and which has both source and drain terminals connected to an oscillator-input terminal (218) at which is provided an alternating signal voltage.

9. The improved charge pump circuit of claim 8 including: second charge pump (236) having:

a second high-voltage setup transistor (250) which has a drain terminal connected to the high voltage setup line (244), which has a gate terminal connected to the pump output terminal (228), and which has a drain second pump-gate terminal (256);

a second pump transistor (252) which has a drain terminal and a gate terminal, both connected to the source terminal of the second setup transistor, and which has a source terminal connected to the pump output terminal (228);

a second capacitor-connected transistor (254) which has a gate terminal connected to the source terminal of the second setup transistor and which has source and drain terminals connected to the oscillator-input terminal (258) at which is provided an alternating signal voltage.

10. The improved charge pump circuit of claim 8 including:

a shunt transistor (220) which has a source terminal connected to a ground reference voltage, which has a drain terminal connected to the column select transistor gate terminal (210), and which has a gate terminal which is coupled to the shift register output terminal (232) at which is provided a select signal to activate the select transistor such that the shunt transistor (220) connects the column select transistor gate terminal (210) to the ground reference voltage when the shift register output terminal (232) is not activated.

11. The improved charge pump circuit of claim 8 wherein said transistors are NMOS transistors.

12. The improved charge pump circuit of claim 8 including means for selecting a memory cell to be programmed from a plurality of memory cells, wherein said means for selecting includes means for selecting a column and a row corresponding to the selected memory cell.

13. An improved dual charge pump circuit for programming an anti-fuse memory cell, comprising:

a memory cell (202) to be programmed from a high-voltage programming current source (208), wherein the memory cell includes an anti-fuse link (204) having a first terminal and a second terminal;

a column-select transistor (206) having a drain terminal connected to the high voltage current source, having a source terminal connected to the first terminal of the anti-fuse link, and having a gate terminal connected to a column select transistor gate terminal (210);

wherein the memory cell includes a word-selection transistor (212), wherein the word selection transistor has a drain terminal connected to the second terminal of the anti-fuse link, wherein the word selection transistor has a source terminal connected to a ground reference voltage, and wherein the word selection transistor has a gate terminal connected to a word selection line (214);

a high-voltage blocking transistor (230) having a drain terminal connected to a shift register output terminal (232) at which is provided a select signal to activate the high-voltage blocking transistor, the transistor (230) having a gate terminal connected to a VCC voltage, and the high-voltage blocking transistor (230) having a source terminal connected to a pump output terminal (228);

a first charge pump (234) including:

a first high-voltage setup transistor (238), which has a drain terminal connected to a high-voltage setup line (244), which has a gate terminal connected to pump output terminal (228) and which has a source terminal (246) connected to a pump gate terminal (246);

a first pump transistor (240) which has a drain terminal and a gate terminal, both connected to the source terminal of the first setup transistor, and which has a source terminal connected to the pump output terminal (228);

a first capacitor-connected transistor (242) which has a gate terminal connected to the source terminal of the first setup transistor and which has source and drain terminals connected to an oscillator-input terminal (248) at which is provided an alternating signal voltage;

a second charge pump (236) having:
  a second high-voltage setup transistor (250) which has a drain terminal connected to the high-voltage setup line (244), which has a gate terminal connected to the pump output terminal (228), and which has a source terminal connected to a second pump-gate terminal (256);
  a second pump transistor (252) which has a drain terminal and a gate terminal, both connected to the source terminal of the second setup transistor, and which has a source terminal connected to the pump output terminal (228);
  a second capacitor-connected transistor (254) which has a gate terminal connected to the source terminal of the second setup transistor and which has source and drain terminals connected to the oscillator-input terminal (258) at which is provided an alternating signal voltage;
a diode-connected trapping transistor (226) which has a gate terminal and a drain terminal both connected to the pump output terminal (228) and which has a source terminal connected to column select transistor gate terminal (210);
a charge-kicker circuit including a capacitor-connected transistor (216), which has a gate terminal connected to the column select transistor gate terminal (210) and which has both source and drain terminals connected to an oscillator-input terminal (218) at which is provided an alternating signal voltage.

14. The improved dual charge pump circuit for programming an anti-fuse memory cell of claim 13 including:
  a shunt transistor (220) which has a source terminal connected to a ground reference voltage, which has a drain terminal connected to the column select transistor gate terminal (210), and which has a gate terminal which is coupled to the shift register output terminal (232) at which is provided a select signal to activate the select transistor such that the shunt transistor (220) connects the column select transistor gate terminal (210) to the ground reference voltage when the shift register output terminal (232) is not activated.

15. The improved dual charge pump circuit for programming an anti-fuse memory cell of claim 13 wherein said transistors are NMOS transistors.

16. The improved dual charge pump circuit for programming an anti-fuse memory cell of claim 13 including means for selecting a memory cell to be programmed from a plurality of memory cells, wherein said means for selecting includes means for selecting a column and a row corresponding to the selected memory cell.

17. An improved method of charge pumping, comprising the steps of:
  providing a select signal to a drain terminal of a high-voltage blocking transistor (230) having a drain terminal connected to a shift register output terminal (232) at which is provided a select signal to activate the select transistor, the high-voltage blocking transistor (230) having a gate terminal connected to a VCC voltage, and the high-voltage blocking transistor (230) having a source terminal connected to a charge pump output terminal (228);
  pumping the pump output terminal (228) with a first charge pump circuit which includes:
    a first high-voltage setup transistor (238), which has a drain terminal connected to a high-voltage setup line (244), which has a gate terminal connected to pump output terminal (228), and which has a source terminal connected to a pump gate terminal (246);
    a first pump transistor (240) which has a drain terminal and a gate terminal, both connected to the pump-gate terminal (246) of the first high-voltage setup transistor, and which has a source terminal connected to the pump output terminal (228);
    a first capacitor-connected transistor (242) which has a gate terminal connected to the pump-gate terminal (246) of the first setup transistor (238) and which has source and drain terminals connected to an oscillator-input terminal (248) at which is provided an alternating signal voltage;
  trapping voltage on the column select transistor gate terminal (210) with a diode-connected trapping transistor (226) which has a gate terminal and a drain terminal both connected to the pump output terminal (228) and which has a source terminal connected to column select transistor gate terminal (210);
  increasing the voltage on column select transistor gate terminal (210) with a charge-kicker circuit including a capacitor-connected transistor (216), which has a gate terminal connected to column select transistor gate terminal (210) and which has both source and drain terminals connected to an oscillator-input terminal (218) at which is provided an alternating signal voltage.

18. The improved method of charge pumping of claim 17 further including the step of:
  pumping the first pump terminal (228) with a second charge pump circuit which includes:
    a second setup transistor (250) which has a drain terminal connected to the high voltage setup line (244), which has a gate terminal connected to the pump output terminal (228), and which has a source second pump-gate terminal (256);
    a second pump transistor (252) which has a drain terminal and a gate terminal, both connected to the source second pump-gate terminal (256) of the second setup transistor, and which has a source terminal connected to the pump output terminal (228);
    a second capacitor-connected transistor (254) which has a gate terminal connected to the source second pump-gate terminal (256) of the second setup transistor and which has source and drain terminals connected to the oscillator-input terminal (258) at which is provided an alternating signal voltage.

19. The improved method of charge pumping of claim 17 further including the step of:
  shunting the voltage on the column select transistor gate terminal (210) to a ground reference voltage through a shunt transistor (220) which has a source terminal connected to a ground reference voltage, which has a drain terminal connected to the column select transistor gate terminal (210), and which has a gate terminal which is coupled to the shift register output terminal (232) at which is provided a select signal to activate the select transistor such that the shunt transistor (220) connects the gate-control terminal (210) to the ground reference voltage when the high-voltage blocking transistor (230) is not activated.

20. An improved method of charge pumping using two oppositely-phased charge pumps, comprising the steps of:
  providing a select signal to a drain terminal of a high-voltage blocking transistor (230) having a drain terminal connected to a shift register output terminal (232) at which is provided a select signal to activate the select transistor, the high-voltage blocking transistor (230) having a gate terminal connected to a VCC voltage; and the high-voltage blocking transistor (230) having a source terminal connected to a pump output terminal (228);

pumping the first pump terminal (228) with a first charge pump circuit which includes:
a first high-voltage setup transistor (238), which has a drain terminal connected to a high voltage setup line (244), which has a gate terminal connected to and which has a source terminal connected to a first pump-gate terminal (246);
a first pump transistor (240) which has a drain terminal and a gate terminal, both connected to the source pump-gate terminal (246), and which has a source terminal connected to the pump output terminal (228);
a first capacitor-connected transistor (242) which has a gate terminal connected to the source terminal (246) of the first setup transistor and which has source and drain terminals connected to an oscillator-input terminal (248) at which is provided a first alternating signal voltage;

pumping the first pump terminal (228) with a second charge pump circuit which includes:
a second setup transistor (250) which has a drain terminal connected to the high voltage setup line (244), which has a gate terminal connected to the pump output terminal (228), and which has a source terminal connected to a second pump-gate terminal (256);
a second pump transistor (252) which has a drain terminal and a gate terminal, both connected to the source second pump-gate terminal (256) and which has a source terminal connected to the pump output terminal (228);
a second capacitor-connected transistor (254) which has a gate terminal connected to the second pump-gate terminal (256) and which has source and drain terminals connected to a second oscillator-input terminal (258) at which is provided an alternating signal voltage having a phase opposite to the phase of the first alternating voltage;

trapping voltage on the column select transistor gate terminal (210) with a diode-connected trapping transistor (226) which has a gate terminal and a drain terminal both connected to the pump output terminal (228) and which has a source terminal connected to the column select transistor gate terminal (210);

increasing the voltage on the column select transistor gate terminal (210) with a charge-kicker circuit including a capacitor-connected transistor (216), which has a gate terminal connected to the column select transistor gate terminal (210) and which has both source and drain terminals connected to an oscillator-input terminal (218) at which is provided an alternating signal voltage.

21. The improved method of charge pumping of claim 20 including the steps of:

shunting the voltage on the column select transistor gate terminal (210) to a ground reference voltage through a shunt transistor (220) which has a source terminal connected to a ground reference voltage, which has a drain terminal connected to the column select transistor gate terminal (210), and which has a gate terminal which is coupled to the shift register output terminal (232) at which is provided a select signal to activate the select transistor such that the shunt transistor (220) connects the gate-control terminal (210) to the ground reference voltage when the high-voltage blocking transistor (230) is not activated.

22. An improved method for programming an anti-fuse memory cell, comprising:

providing a memory cell (202) to be programmed from a high-voltage programming current source (208), wherein the memory cell includes an anti-fuse link (204) having a first terminal and a second terminal;

providing a column-selection transistor (206) having a drain terminal connected to the high voltage current source, having a source terminal connected to the first terminal of the anti-fuse link, and having a gate terminal connected to a column-select transistor gate terminal (210);

wherein the memory cell includes a word-selection transistor (212), wherein the word selection transistor has a drain terminal connected to the second terminal of the anti-fuse link, wherein the word selection transistor has a source terminal connected to a ground reference voltage, and wherein the word selection transistor has a gate terminal connected to a word selection line (214);

providing a select signal to a drain terminal of a high-voltage blocking transistor (230) having a drain terminal connected to a shift register output terminal (232) at which is provided a select signal to activate the high-voltage blocking transistor, the high-voltage blocking transistor (230) having a gate terminal connected to a VCC voltage; and the high-voltage blocking transistor (230) having a source terminal connected to a pump output terminal (228);

pumping the first pump terminal (228) with a first charge pump circuit which includes:
a first high-voltage setup transistor (238), which has a drain terminal connected to a high-voltage setup line (244), which has a gate terminal connected to the pump output terminal (228) and which has a source terminal connected to a pump-gate terminal (246);
a first pump transistor (240) which has a drain terminal and a gate terminal, both connected to the source pump-gate terminal (246) of the first setup transistor, and which has a source terminal connected to the pump output terminal (228);
a first capacitor-connected transistor (242) which has a gate terminal connected to the source pump-gate terminal (246) of the first setup transistor and which has source and drain terminals connected to an oscillator-input terminal (248) at which is provided an alternating signal voltage;

trapping voltage on the column select transistor gate terminal (210) with a diode-connected trapping transistor (226) which has a gate terminal and a drain terminal both connected to the pump output terminal (228) and which has a source terminal connected to the column select transistor gate terminal (210);

increasing the voltage on the column select transistor gate terminal (210) with a charge-kicker circuit including a capacitor-connected transistor (216), which has a gate terminal connected to the column select transistor gate terminal (210) and which has both source and drain terminals connected to an oscillator-input terminal (218) at which is provided an alternating signal voltage.

23. The improved method for programming an anti-fuse memory cell of claim 22, further comprising the step of pumping the pump output terminal (228) with a second charge pump circuit which includes:

a second high-voltage setup transistor (250) which has a drain terminal connected to the high voltage setup line (244), which has a gate terminal connected to the pump output terminal (228), and which has a source terminal (256);

a second pump transistor (252) which has a drain terminal and a gate terminal, both connected to the source second pump-gate terminal (256) of the second setup transistor, and which has a source terminal connected to the pump output terminal (228);

a second capacitor-connected transistor (254) which has a gate terminal connected to the source second pump-gate terminal (256) of the second setup transistor and which has source and drain terminals connected to the oscillator-input terminal (248) at which is provided an alternating signal voltage.

24. The improved method for programming an anti-fuse memory cell of claim 22, further comprising the step of shunting the voltage on the column select transistor gate terminal (210) to a ground reference voltage through a shunt transistor (220) which has a source terminal connected to a ground reference voltage, which has a drain terminal connected to the column select transistor gate terminal (210), and which has a gate terminal which is coupled to the shift register output terminal (232) at which is provided a select signal to activate the select transistor such that the shunt transistor (220) connects the gate-control terminal (210) to the ground reference voltage when the high-voltage blocking transistor (230) is not activated.

25. The improved method for programming an anti-fuse memory cell of claim 22, further comprising the step of selecting one of said memory cells for programming from a plurality of memory cells by selecting a column and a row corresponding to the selected memory cell from the plurality of memory cells.

26. An improved method for programming an anti-fuse memory cell, comprising:

providing a memory cell (202) to be programmed from a high-voltage programming current source (208), wherein the memory cell includes an anti-fuse link (204) having a first terminal and a second terminal;

providing a column-selection transistor (206) having a drain terminal connected to the high voltage current source, having a source terminal connected to one terminal of the anti-fuse link, and having a gate terminal connected to a column select transistor gate terminal (210);

wherein the memory cell includes a word-selection transistor (212), wherein the word selection transistor has a drain terminal connected to the second terminal of the anti-fuse link, wherein the word selection transistor has a source terminal connected to a ground reference voltage, and wherein the word selection transistor has a gate terminal connected to a word selection line (214);

providing a select signal to a drain terminal of a high-voltage blocking transistor (230) having a drain terminal connected to a shift register output terminal (232) at which is provided a select signal to activate the high-voltage blocking transistor, the high-voltage blocking transistor (230) having a gate terminal connected to a VCC voltage; and the high-voltage blocking transistor (230) having a source terminal connected to a pump output terminal (228);

pumping the first pump terminal (228) with a first charge pump circuit which includes:

a first high-voltage setup transistor (238), which has a drain terminal connected to a high-voltage setup line (244), which has a gate terminal connected to the pump output terminal (228) and which has a source terminal connected to a first pump-gate terminal (246);

a first pump transistor (240) which has a drain terminal and a gate terminal, both connected to the source pump-gate terminal (246) of the first setup transistor, and which has a source terminal connected to the pump output terminal (228);

a first capacitor-connected transistor (242) which has a gate terminal connected to the drain pump-gate terminal (246) of the first setup transistor and which has source and drain terminals connected to an oscillator-input terminal (248) at which is provided an alternating signal voltage;

pumping the first pump terminal (228) with a second charge pump circuit which includes:

a second high-voltage setup transistor (250) which has a drain terminal connected to the high-voltage setup line (244), which has a gate terminal connected to the pump terminal (228); and which has a source terminal (256) connected to a second pump-gate terminal (256);

a second pump transistor (252) which has a drain terminal and a gate terminal, both connected to the source second pump-gate terminal (256) of the second setup transistor, and which has a source terminal connected to the pump output terminal (228);

a second capacitor-connected transistor (254) which has a gate terminal connected to the second pump-gate terminal (256) of the second setup transistor and which has source and drain terminals connected to the oscillator-input terminal (258) at which is provided an alternating signal voltage;

trapping voltage on the column select transistor gate terminal (210) with a diode-connected trapping transistor (226) which has a gate terminal and a drain terminal both connected to the first pump terminal (228) and which has a source terminal connected to column select transistor gate terminal (210);

increasing the voltage on the column select transistor gate terminal (210) with a charge-kicker circuit including a capacitor-connected transistor (216), which has a gate terminal connected to column select transistor gate terminal (210) and which has both source and drain terminals connected to an oscillator-input terminal (218) at which is provided an alternating signal voltage.

27. The improved method for programming an anti-fuse memory cell of claim 26, further comprising the step of shunting the voltage on the column select transistor gate terminal (210) to a ground reference voltage through a shunt transistor (220) which has a source terminal connected to a ground reference voltage, which has a drain terminal connected to the gate-control terminal (210), and which has a gate terminal which is coupled to the shift register output terminal (232) at which is provided a select signal to activate the select transistor such that the shunt transistor (220) connects the column select transistor gate terminal (210) to the ground reference voltage when the shift register output terminal (232) is not activated.

28. The improved method for programming an anti-fuse memory cell of claim 26, further comprising the step of selecting one of said memory cells for programming from a plurality of memory cells by selecting a column and a row corresponding to the selected memory cell from the plurality of memory cells.

* * * * *